United States Patent
Wu et al.

(10) Patent No.: US 9,418,939 B2
(45) Date of Patent: Aug. 16, 2016

(54) CONTACT STRUCTURE FOR NAND BASED NON-VOLATILE MEMORY DEVICE AND A METHOD OF MANUFACTURE

(71) Applicant: Macronix International Co., Ltd., Hsinchu (TW)

(72) Inventors: Ming-Tsung Wu, Zhubei (TW); Shih-Ping Hong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/539,368

(22) Filed: Nov. 12, 2014

(65) Prior Publication Data

US 2016/0133568 A1   May 12, 2016

(51) Int. Cl.
  *H01L 29/788*   (2006.01)
  *H01L 23/535*   (2006.01)
  *H01L 27/115*   (2006.01)
  *H01L 21/768*   (2006.01)

(52) U.S. Cl.
  CPC ........ *H01L 23/535* (2013.01); *H01L 21/76895* (2013.01); *H01L 27/1157* (2013.01); *H01L 27/11524* (2013.01); *H01L 27/11548* (2013.01); *H01L 27/11551* (2013.01); *H01L 27/11556* (2013.01); *H01L 27/11575* (2013.01); *H01L 27/11578* (2013.01); *H01L 27/11582* (2013.01)

(58) Field of Classification Search
  CPC ................... H01L 27/11514; H01L 27/11551; H01L 27/11578; H01L 27/11597; H01L 27/0688; H01L 23/535; H01L 27/11524; H01L 27/11548
  USPC ................... 438/129, 599, 666; 257/315, 773
  See application file for complete search history.

(56) References Cited

U.S. PATENT DOCUMENTS

| | | | | |
|---|---|---|---|---|
| 2010/0264545 A1* | 10/2010 | Collins | ................. | H01L 23/522 257/773 |
| 2011/0198687 A1* | 8/2011 | Lee | ..................... | H01L 27/0688 257/326 |
| 2014/0264898 A1* | 9/2014 | Hu | ........................ | H01L 21/768 257/773 |

* cited by examiner

*Primary Examiner* — Andres Munoz
*Assistant Examiner* — Maria Ligai
(74) *Attorney, Agent, or Firm* — Fish & Richardson P.C.

(57) ABSTRACT

A NAND-based non-volatile memory contact structure includes a trench located adjacent to layered alternating conducting and insulating layers, the layers lining sides and bottom of the trench. A portion of the trench is removed to expose a surface in which electrical connections to the conducting layers are provided on one level.

25 Claims, 7 Drawing Sheets

CONTACT STRUCTURE FOR NAND BASED NON-VOLATILE MEMORY DEVICE AND A METHOD OF MANUFACTURE

BACKGROUND OF THE INVENTION

1. Field of the Invention

The present invention relates generally to semiconductor devices and, more particularly, to memory modules and methods of making same.

2. Description of Related Art

As densities of semiconductor memories increase, two-dimensional structures are no longer able to meet specified requirements. Accordingly, three-dimensional memories are becoming known, although manufacturing processes for fabricating three-dimensional memories pose special problems. One approach to creating memory structures in three dimensions involves forming memory components comprising conducting planes or surfaces disposed in horizontal layers of staircase structures.

The staircase structures may be formed by first laying down alternating layers of insulating material (e.g., oxide) and conducting material (e.g., polysilicon). Sequential mask/photo/etch steps can then be performed with photoresist being incrementally peeled back between etch steps, thereby performing etches of monotonically increasing depth to create multiple conducting surfaces of staircase structures.

Figure 1:
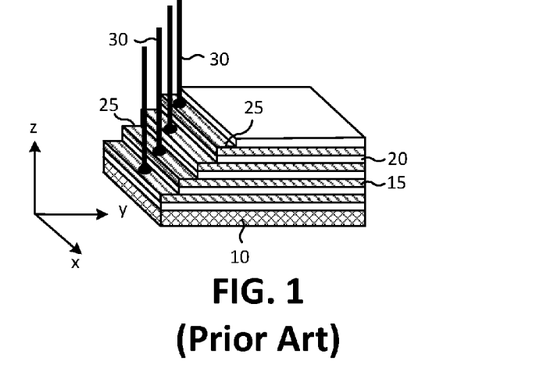
FIG. 1 is a perspective sketch of a prior art staircase contact structure.

A prior art staircase structure that supports a four-layer 3D memory device is illustrated in FIG. 1. The structure comprises a substrate 10 with conducting layers 15 and insulating layers 20 disposed alternately on the substrate 10. The structure has been subjected to multiple etches to form steps or areas 25 that expose surfaces of the conducting layers 15. Conducting elements 30 may connect the conducting layers 15 to higher layers (not shown) in the memory device.

A staircase structure such as that illustrated may be filled-in with insulating material, e.g., oxide (not shown in FIG. 1), and openings may be formed in the oxide to enable contact with the steps of the staircase. The contact openings may be filled with conducting material to create vertically-oriented conducting elements 30, thereby providing electrical access to surfaces of the conducting layers.

Staircase contact structures and other prior art structural elements and methods of manufacture for 3D memory devices must cope with significant challenges such as controlling simultaneous multi-step procedures required for etching as well as forming contact openings with extremely high aspect ratios that must land on very small steps and/or conducting layers.

The aforementioned problems need to be addressed and must be overcome in the face of ever-increasing die density.

A need thus exists for NAND based non-volatile memory, for example, three-dimensional (3D) semiconductor memory, contact structures that do not require widely varying and/or extremely large aspect ratios. A further need exists for a method of forming such 3D semiconductor memory contact structures.

SUMMARY OF THE INVENTION

The present invention addresses these needs and others by providing, in one example, a contact structure for a NAND-based non-volatile memory device, for example, a three-dimensional (3D) semiconductor NAND-based memory device, comprising alternating layers of conducting material and insulating material disposed horizontally over a substrate in a first region of a structure and a trench formation in a second region of the structure adjacent to the first region, the trench formation being configured with continuations of the alternating layers of conducting material and insulating material disposed on at least one side of the trench. A cut-away portion of the trench formation exposes the continuations of conducting material on one level in a horizontal plane, the cut-away portion being effective, for example, being sized and/or positioned, to enable one or more electrical connections between the layers of conducting material and vertically-oriented conducting structures.

In one example, the contact structure may comprise vertically-oriented conducting structures that are electrically connected with the horizontally exposed continuations of the layers of conducting material.

In one example, continuations of alternating layers of conducting material and insulating material may be disposed on two sides and a bottom of the trench. In one example, redundant vertically-oriented conducting structures may be connected with the continuations of the layers of conducting material.

An implementation of a method of forming a contact structure, for example, a NAND-based non-volatile memory contact structure or a 3D NAND contact structure may comprise providing a silicon substrate, patterning a trench location in the substrate, and etching according to the pattern to form a trench in the substrate such that a horizontal portion of the substrate is not etched. A buffer material may be deposited to overlay the horizontal portion of the substrate and to line the trench. Alternating conducting layers and insulating layers may be deposited on the buffer material to overlay the buffer material on the horizontal portion of the substrate and to line the trench with continuations of the alternating conducting layers and insulating layers. An etch step may expose a portion of the trench, thereby exposing the continuations of the conducting layers. Vertically-oriented conducting structures that connect electrically to the exposed continuations of the conducting layers may be provided.

While the structure and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE DRAWINGS

FIG. 6F describes the structure of FIG. 6E after oxide fill-in;

DETAILED DESCRIPTION OF THE INVENTION

Examples of the invention are now described and illustrated, in the accompanying drawings, instances of which are to be interpreted to be to scale in some implementations while in other implementations, for each instance, not In certain aspects, use of dike or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a contact structure for three-dimensional (3D) semiconductor memories and a related method of manufacture. The present invention is not limited to such 3D semiconductor memory contact structures and related methods of manufacture, and may have applicability to other contact structures and methods of manufacture, for example, to NAND based non-volatile memory device contact structures and methods of manufacture.

Figure 1A:
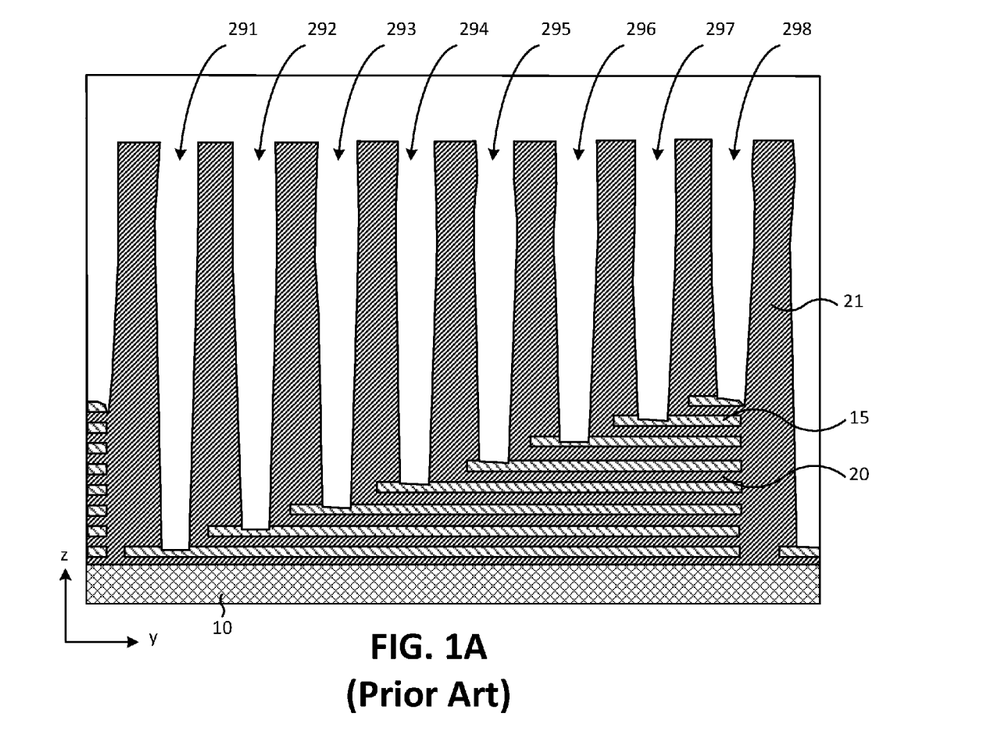
FIG. 1A is a simplified cross-sectional view of a prior-art contact structure based upon an eight-step staircase.

Referring more particularly to the drawings, FIG. 1A illustrates an example in a simplified diagram of a partially-completed 3D memory device based upon an eight-step staircase structure. The device is formed on a substrate 10 with alternating staircase layers of conducting material 15 that may form, for example, wordlines and the like, and dielectric material 20 on which is formed an interlayer dielectric (ILD) 21 having contact openings 291-298 formed therein. The contact openings 29 -298, which may be filled with conducting material to connect to the conducting layers 15, are characterized by varying or different aspect ratios.

Formation of the contact openings 291-298 may involve a several-step etch process, according to one representative prior-art method. For example, the eight-step staircase structure may be overlaid with an etch stop layer (ESL, not shown in FIG. 1A), which may be formed of silicon nitride (SIN), silicon oxynitride (SION) and/or combinations thereof. The etch stop layer also may include at least one metal oxide layer, for example, an aluminum oxide layer, a hafnium oxide layer, a titanium oxide layer, a tantalum oxide layer, a zirconium oxide layer, a germanium oxide layer, and the like and combinations thereof. Furthermore, the etch stop layer (ESL) may include a material containing silicon, for example, silicon carbon nitride (SiCN), silicon oxycarbide (SiOC), silicon carbide (SiC), and the like and combinations thereof. The ILD 21 may then be deposited, and the result may be patterned according to specified contact openings. An ILD etch process may remove ILD material from each contact opening, stopping on the ESL. Completion of formation of the contact openings 291-298 may be achieved using, for example, a breakthrough (BT) process, to break through the ESL, stopping on the conducting layers 15. Filling the contact openings with conducting material creates contacts with individual conducting layers 15.

The process window for the ESL breakthrough step is very narrow, owing to wide-ranging aspect ratios between contact openings, e.g., contact openings 298 and 291. These aspect ratios may vary over a range of 2:1, 3:1 or more, which may subject the ESL in contact opening 298 to a considerable over-etch before the ILD material in the remaining contact openings (especially contact opening 291) is removed. The ILD etch process must not punch through the ESL in contact opening 291 before the ILD etch process is completed in contact opening 298.

Figure 2:
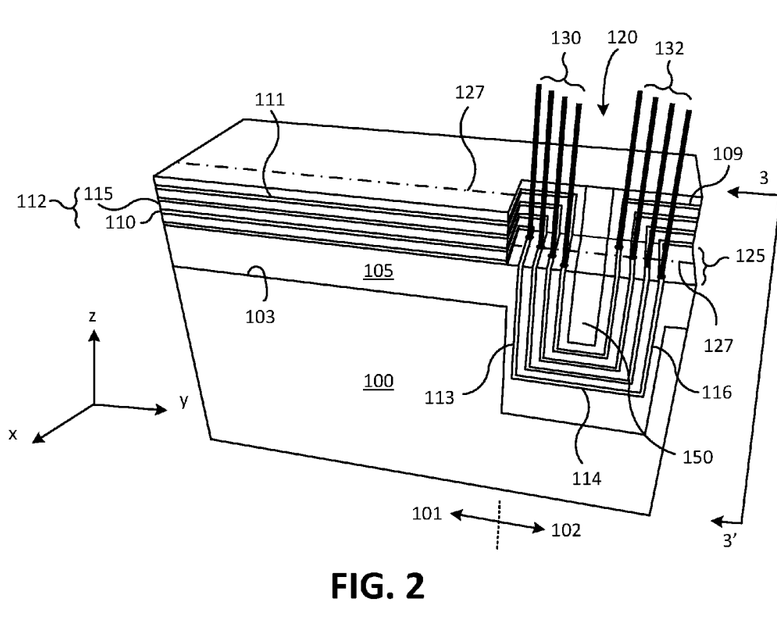
FIG. 2 illustrates, in perspective, a non-staircase contact structure in accordance with the present disclosure.

FIG. 2 illustrates a contact structure for a 3D semiconductor NAND memory device more fully described herein that does not employ a staircase structure, thereby avoiding the aforementioned problems. The example illustrated in FIG. 2 comprises a substrate 100 that may be formed of a suitable material, for example, silicon. The structure of FIG. 2 includes a buffer material layer 105 that overlies the substrate 100 and further includes alternating layers of conducting material 110 and layers of insulating material 115.

The conducting material 110 may comprise any suitable conducting material including, for example, polysilicon, metal, any other conductive compound, and/or combinations of materials such as Al, Cu, W, Ti, Co, Ni, TiN, TaN, TaAlN, and the like.

The layers of insulating material 115 may be formed of, for example, oxide such as an oxide of silicon, including $SiO_2$, SiOC, or SiOF, and/or nitride, oxynitride, silicate, and the like. Implementations may incorporate low dielectric contant (low-k) materials having a dielectric constant less than that of silicon dioxide, such as $SiCHO_x$ (x being a positive integer), which may be preferred. Other implementations may be formed using high dielectric constant (high-k) materials having a dielectric constant greater than that of silicon dioxide, such as $HfO_x$, HfON, $AlO_x$, $RuO_x$, $TiO_x$, x being a positive integer, and the like.

Pairs of conducting/insulating layers 110/115, which may be referred to herein as OP layer pairs 112, may be disposed horizontally over the substrate 100 in a first region 101 of the structure.

Figure 3A:
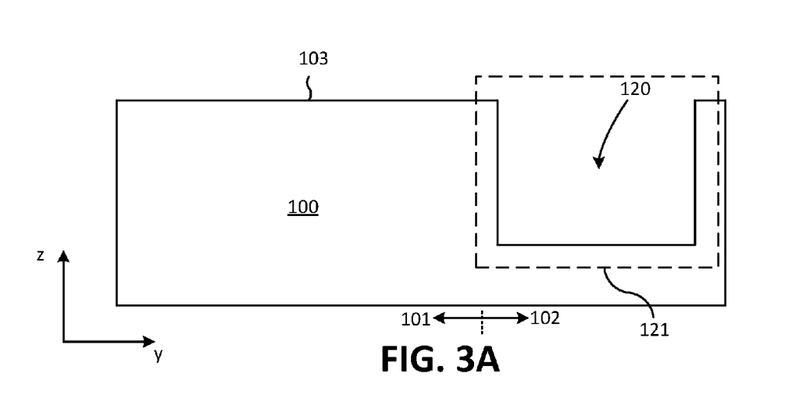
FIG. 3A shows, in cross-section, a result of forming a trench in a silicon substrate as a step in fabricating a non-staircase contact structure according to the present disclosure.

A trench 120 may be formed in a second region 102 adjacent to the first region 101 of the substrate 100 as illustrated in FIG. 3A, which is a view of a partially-completed version of the structure of FIG. 2 taken along a cross-section defined by a line 3-3' (through centerline 127). The substrate 100 may have a substantially horizontal surface 103. Dimensions of the trench 120 may be chosen according to the number of contact layers to be supported. For example, when four (4) contact layers (i.e., four pairs of conducting/insulating layers) are used, the trench may have a depth of about 2000 ∈ at a minimum. A typical value of depth of the trench may be about 5500 Å, and a width of the trench 120 may have a value of about 360 nm at a minimum. A typical value for the trench width in this case is about 550 nm.

Figure 3B:
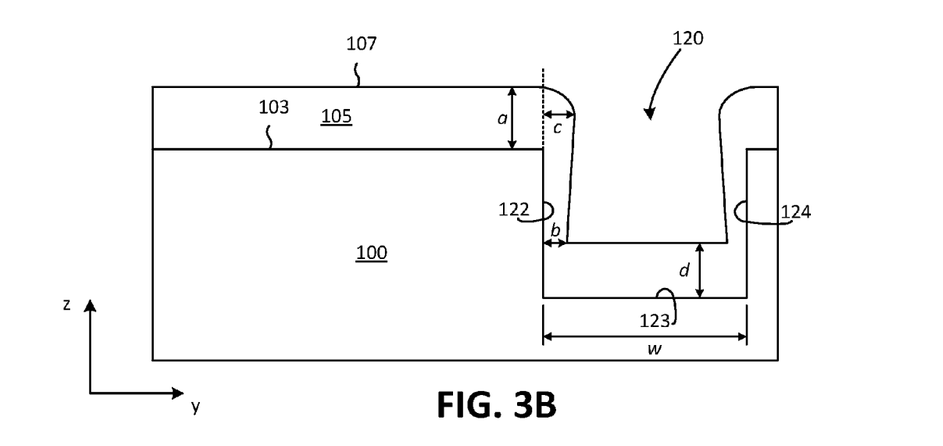
FIG. 3B describes a result of depositing a buffer material on the structure of FIG. 3A.

The buffer material layer 105 may be formed on the substrate 100 and trench 120 of the structure of FIG. 3A as shown in FIG. 3B. The buffer material, for example, making up buffer material layer 105, may be any suitable buffer material. Examples of useful buffer materials include one or more of oxide, nitride, oxynitride, silicate and the like. The buffer material layer 105, which may comprise a substantially horizontal surface 107, may cover first/second sides 122/124 and bottom 123 of the trench 120 as well as the surface 103 of the substrate 100. A thickness of the buffer material 105 may vary according to buffer material step coverage and conformity parameters. FIG. 3B identifies dimensions of the buffer material layer 105 including an upper thickness, a, a trench sidewall minimum thickness, b, a trench sidewall maximum thickness, c, a trench bottom thickness, d, and a trench width, w. TABLE 1 provides a summary of ratios of these characteristics with respect to dimensions given in FIG. 3B. It is desirable to make the Sidewall Step Coverage ratio, b/a, as small as possible, as a lower value of b/a results in a smaller value for trench width, w, which may reduce cell area.

TABLE 1

| Parameter | Definition | Approx. Range | Approx. Typical Value |
| --- | --- | --- | --- |
| Sidewall Step Coverage | b/a | 0.05 to 1.00 | 0.1 |
| Conformity | b/c | 0.05 to 1.00 | 1.00 |
| Bottom Step Coverage | d/a | 0.05 to 1.00 | 0.5 |
| Overhang | (c − b)/b | 0 to 1.00 | 0 |

The structure of FIG. 3B may have deposited in sequence on the buffer material layer 105 a layer 110 of conducting material and a layer 115 of insulating material (i.e., an OP layer pair 112). A first horizontal portion 111 of the conducting layer 110 may overlay the horizontal surface 107 of the buffer material layer 105. In one example, the first horizontal portion 111 of the conducting layer 110 is contiguous with a descending continuation 113 thereof disposed over buffer material layer 105 and positioned so as to be partially within trench 120, covering the first side 122. That is, the descending portion 113 of conducting material forms an electrical continuation of the first horizontal portion 111 of the conducting layer 110. As shown in the example illustrated in FIG. 3C, the continuation of the conducting layer 110 may extend into a bottom portion 114 of conducting material disposed in the trench 120, and into an ascending portion 116 of conducting material covering the buffer material layer 105. The four portions 111, 113, 114, and 116 of conducting material are electrically connected to each other and may form a continuous electrical conductor.

Figure 3C:
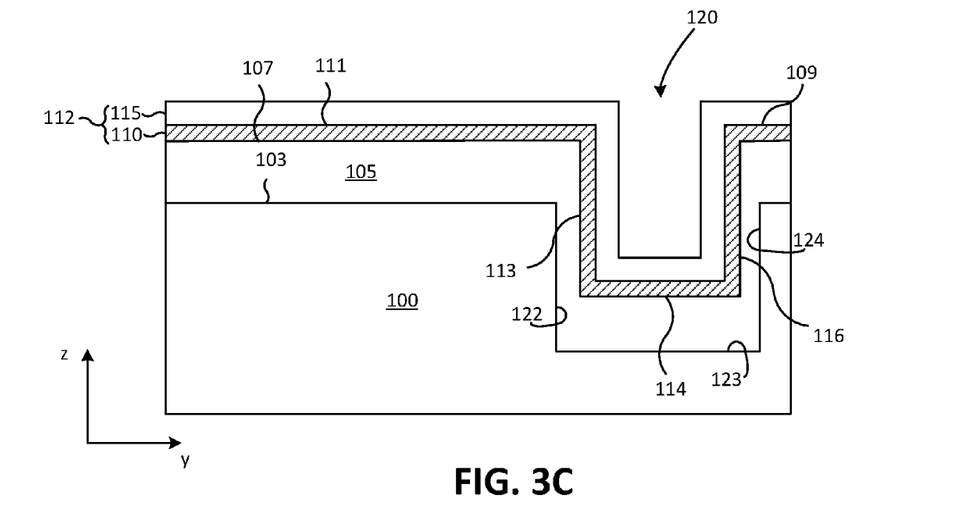
FIG. 3C is a cross-sectional diagram showing the partial formation of a one-layer 3D memory contact structure that includes a trench according to the present disclosure.

In other examples, the structure of FIG. 3C may be extended by overlaying additional OP layer pairs 112 on those shown in FIG. 3C. An example of such a structure having four OP layer pairs 110 is shown in FIG. 2.

Continuing, with reference to FIG. 2, after fill-in with oxide 150, a portion of the trench 120 may be removed (e.g., by a mask/photo/etch procedure), thereby forming a horizontal plane 125 on which continuations of individual conducting layers 110 are exposed at substantially the same level. The structure may be filled-in with insulating material (e.g., oxide, not shown) in which may be formed contact openings that may be filled with conducting material to form a first set of vertically-oriented conducting structures 130. Importantly, the vertically-oriented conducting structures 130, in contrast with the prior-art staircase structure illustrated in. FIGS. 1 and 1A, are formed in contact openings that have the same or substantially the same aspect ratio. Accordingly, use of the illustrated structure may provide an advantage over the prior art staircase structure, which advantage increases, or becomes more pronounced, as a number of OP layer pairs 112 increases. When the number of OP layer pairs 112 is large (e.g., 8, 16, 24, 32, . . . , 72) the width of the trench may be increased as desired in order to accommodate a relatively large number of individual conducting layers. Any disadvantage resulting from semiconductor real estate consumed by this change may have compensating advantages, including improved reliability and improved ease of forming the contact openings because of the smaller aspect ratios and/or smaller variance in aspect ratios when compared with those of the staircase structure.

According to the example illustrated in FIG. 2, the conducting layers 110 include a first horizontal portion 111 and are extended to include a descending portion 113 disposed on the first side 122 of the trench, a bottom portion, 114 disposed on the bottom 123 of the trench 120, an ascending portion 116 disposed on the second side 124 of the trench 120, and a second horizontal portion 109. Additionally, insulating layers 115 may be noted to always be paired with corresponding conducting layers 110 to form OP layer pairs 112.

In addition to the first set of vertically-oriented conducting structures 130 already described, a second set of vertically-oriented conducting structures 132 that connect to ascending portions 116 of the continuations of the conducting layers 110 may be provided. The connections 132 may provide redundant connections to the conducting layers 110, thereby improving reliability of the contact structure.

In an absence of redundant connections, bottom portions 114 and ascending portions 116 of the continuations (i.e., extensions) of the conducting layers 110 may be absent, resulting in a reduced width of the trench. In these cases the descending portion 113 of the extensions of the conducting layers 110 has an effect of converting the x-y orientation of the conducting layers 110 to an x-z orientation in order to facilitate connecting the extensions of the conducting layers 110 to the first set of vertically-oriented conducting structures 130 with a substantially fixed aspect ratio.

Figure 4:
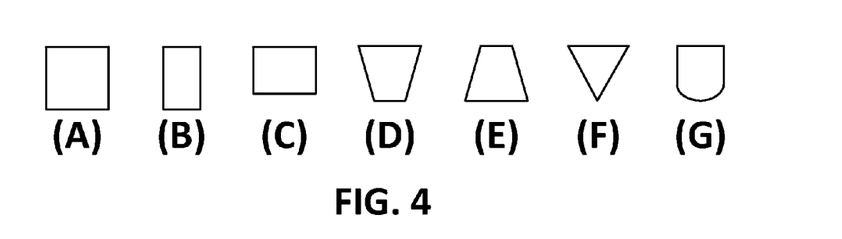
FIG. 4 is a pictorial representation of cross-sections various alternative profiles of the trench of FIGS. 3A-3C.

The trench 120 as illustrated in FIGS. 2, 3A, 3B and 3C may be described, in part by a shape of a profile 121 (FIG. 3A) that is rectangular in the illustrated example. In other cases, the profile of the trench 120 may exhibit different shapes. Some examples of alternative shapes are illustrated in FIG. 4, including a square profile (A), a rectangular profile with a vertical dimension greater than a horizontal dimension thereof (B), and another rectangular profile having a horizontal dimension greater than a vertical dimension. Non-rectangular profiles of the trench 120 also may be employed, including a first trapezoidal profile (D) having an upper base with a length greater than a length of a lower base, a second trapezoidal profile (E) having a lower base with a length greater than that of the length of the upper base, a triangular profile (F), and a partially rounded profile (G). These examples are suggestive of the kinds of profiles that may be employed and are not intended to be limiting. Thus, the trench 120 may be described, at least in part, by a shape of any suitable profile based, for example, on any polygon or combination of polygons, i.e., a polygonal profile.

Figure 5:
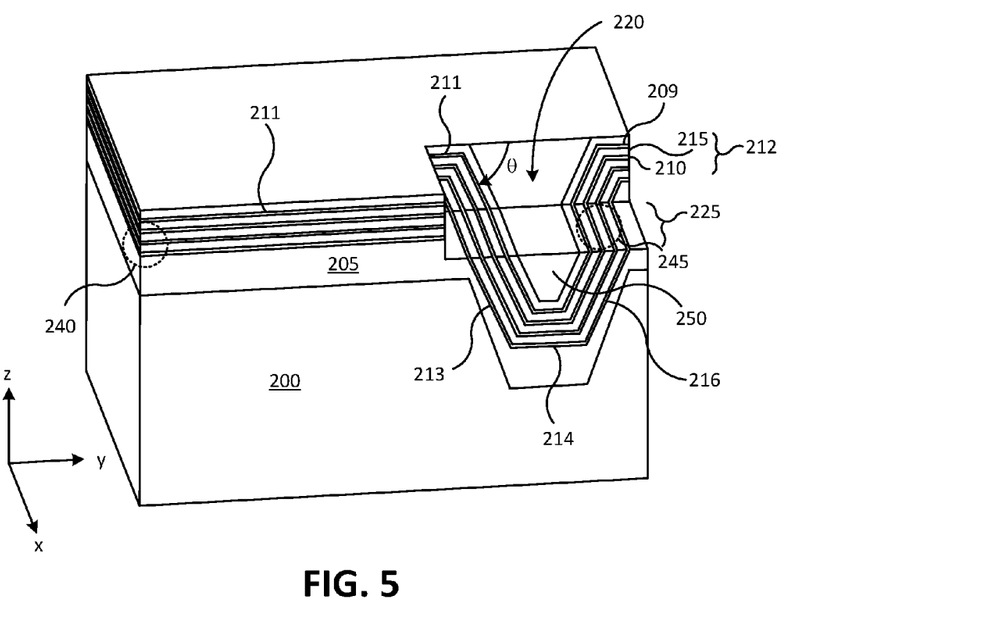
FIG. 5 is a perspective diagram of a contact structure that uses a trench having a trapezoidal profile.

A particular example of a contact structure that employs a trapezoidal trench profile is illustrated in FIG. 5. The contact structure of FIG. 5 may be constructed as illustrated in FIGS. 3A-3C except for the trapezoidal shape of the trench 220. The illustrated example comprises a substrate 200 overlaid with a layer of buffer material 205 on which is overlaid OP layer pairs 212 comprising conducting layers 210 and insulating layers 215. The conducting layers comprise a first horizontal portion 211, a descending portion 213, a bottom portion 214, an ascending portion 216, and a second horizontal portion 209. As was the case in FIG. 2, a cut-away portion of the trench 220 forms a horizontal plane 225 that exposes parts of the descending portion 213 and ascending portion 216 of continuations of the conducting layers 210. These exposed continuations 213/216 may be available for connection with vertically-oriented conductors in a manner similar to that illustrated in FIG. 2.

The descending portion 213 of the continuations of the conducting layers 210 in FIG. 5 is disposed at an angle θ with respect to a horizontal reference. When θ=90°, the structure of FIG. 5 may become similar or substantially identical to that of FIG. 2. When 0<θ<90° then the structure of FIG. 5 generally assumes the form shown.

Figure 5A:
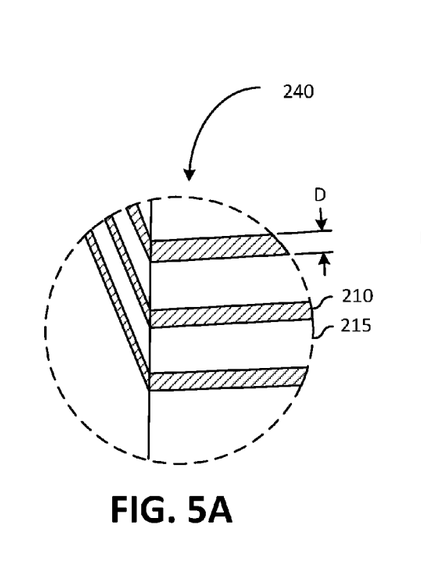
FIG. 5A shows detail of a portion of alternating layers of conducting material and insulating material in the structure of FIG. 5.
Figure 5B:
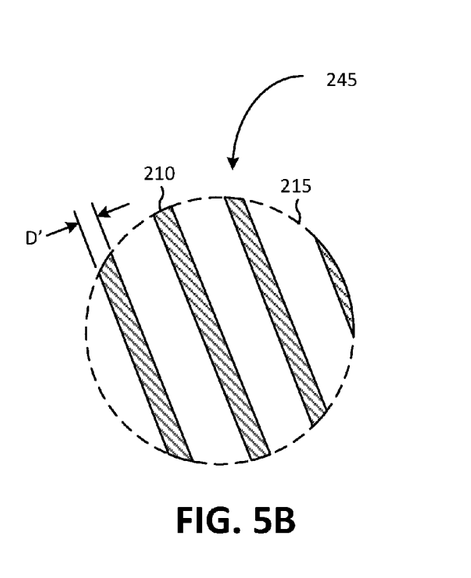
FIG. 5B describes detailed properties of continuations of conducting layers in the structure of FIG. 5.

FIG. 5A shows detail of a small part of the first horizontal portion 211 of the conducting layers 210, identifying a height of a conducting layer 210 as a critical dimension D. FIG. 5B shows corresponding detail of the conducting layers 210 as extended and exposed as the descending continuations 213 in the horizontal plane 225 of the trench 220. A width of the continuation 213 as viewed in a horizontal plane 225 is noted to have a width corresponding to a critical dimension D', where $\sin \theta = D/D'$ or $D' = D/\sin \theta$.

Therefore, when 0<θ<90°, D'>D. For example, when θ=60°, D'=1.15, approximately.

The increased width D' of the continuation 213 may improve reliability of connections with vertically-oriented conducting elements (cf. 130/132 in FIG. 2).

Figure 6:
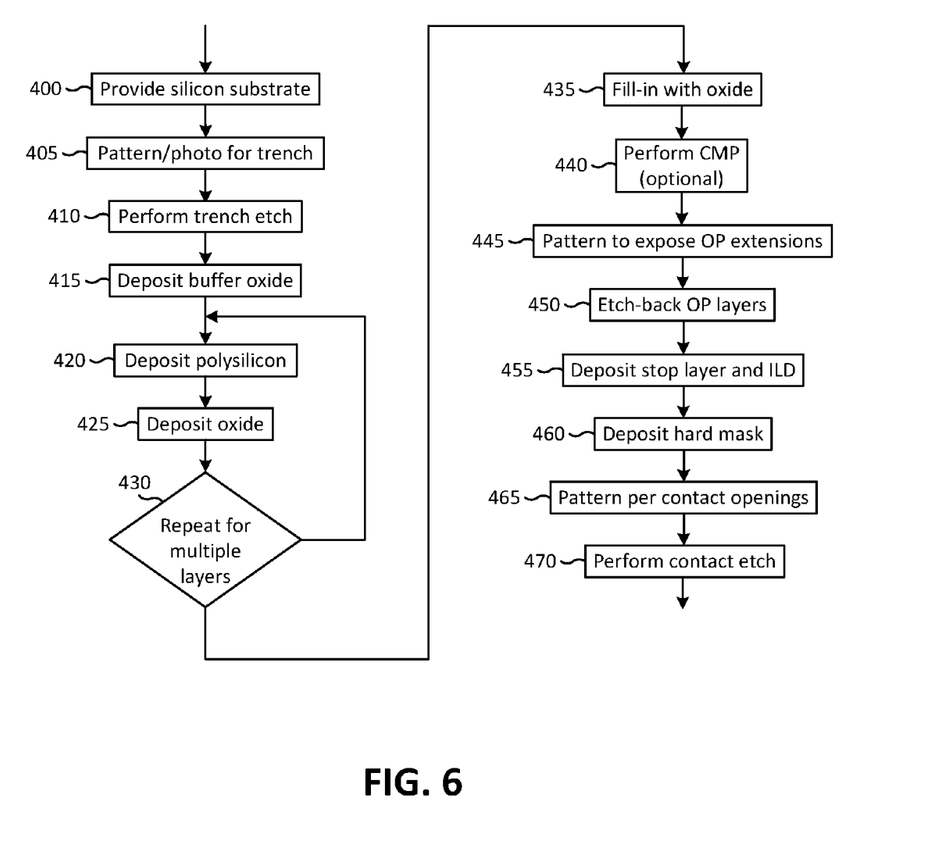
FIG. 6 is a flowchart of one implementation of a method for forming a 3D contact structure having a trench.

Contact structures such as those illustrated as examples in FIGS. 2 and 5 may be constructed according to a method of the present invention. A particular implementation of the method is summarized as a flowchart in FIG. 6.

Figure 6A:
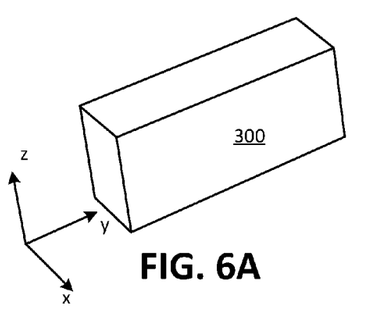
FIG. 6A is a perspective view of a substrate suitable for forming a 3D contact structure.
Figure 6B:
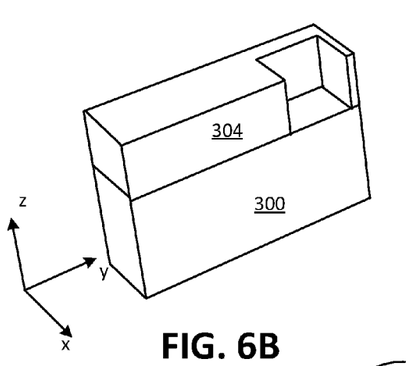
FIG. 6B illustrates, in a perspective view, a photolithographic mask that may define a trench in the substrate of FIG. 6A.
Figure 6C:
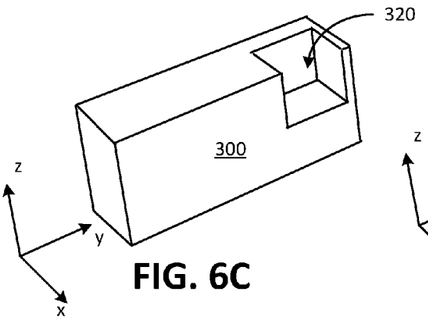
FIG. 6C illustrates a result of trench formation in the substrate according to the mask of FIG. 6B.

According to the illustrated implementation, a silicon substrate 300 is provided at step 400 as illustrated in a perspective view in FIG. 6A. At step 405 a first photolithographic mask (i.e., pattern/photo 304) may be formed on the substrate as shown in FIG. 6B outlining a trench to be formed in the substrate. An etch that forms the trench may be performed according to the pattern/photo at step 410 resulting in formation of a trench 320 as diagrammed in FIG. 6C. FIG. 3 illustrates, in cross-section, another example of a rectangular trench 120 so formed. As noted above, the trench may be formed with other profiles one example of which is illustrated in FIG. 5.

Figure 6D:
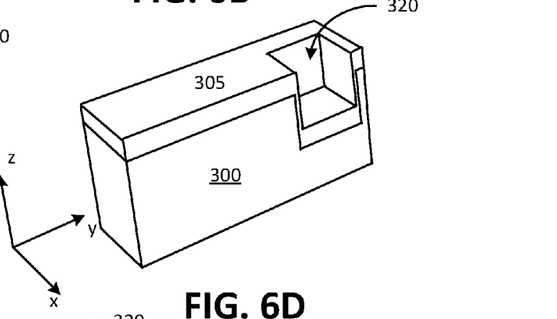
FIG. 6D shows a result of deposition of a buffer material layer on the structure of FIG. 6C.

Referring to FIG. 6D, a buffer material layer 305 may be deposited over the substrate 300 and trench 320 at step 415. As illustrated in the example of FIG. 3B, buffer material 105 may overlie a horizontal portion 103 of the substrate 100 and may line sides 122/124 and bottom 123 of the trench 120.

Figure 6E:
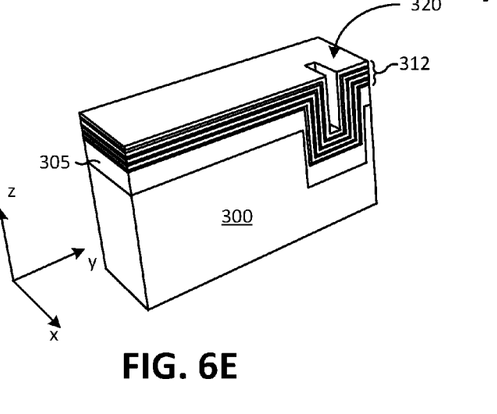
FIG. 6E is a perspective view of a result of deposition of multiple alternating polysilicon/oxide (OP) layers on the structure of FIG. 6D, the layers extending into and lining the trench.

A layer of conducting material (e.g., polysilicon) may be deposited on the buffer material at step 420 as shown in FIG. 6E, and a layer of insulating material (e.g., oxide) may be deposited on the conducting layer at step 425. According to step 430, the alternating deposition of polysilicon and oxide may be repeated at steps 420 and 425 to create multiple OP layers 312.

Figure 6F:
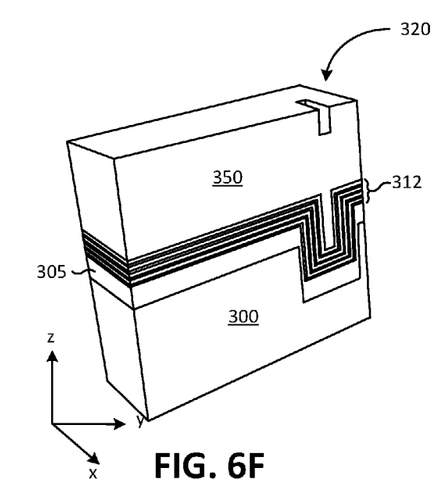

A layer of insulating material (e.g., oxide 350) may be deposited on the structure of FIG. 6E at step 435 to fill-in the trench 320 as shown in FIG. 6F. Excess oxide material may be removed with an optional chemical-mechanical planarization (CMP) procedure at step 440, a result of which is illustrated in FIG. 6G.

Figure 6G:
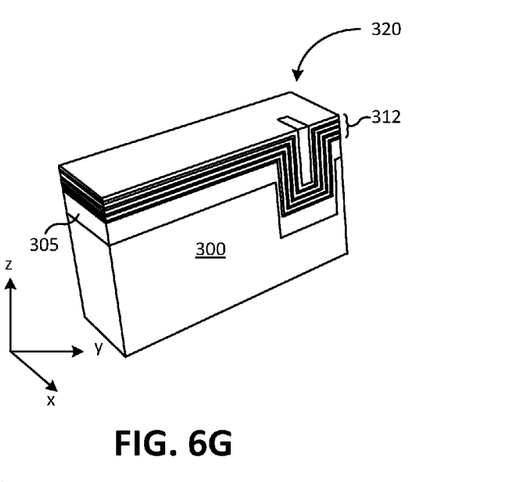
FIG. 6G illustrates a result of performing an optional chemical-mechanical planarization (CMP) process on the structure of FIG. 6F.
Figure 6H:
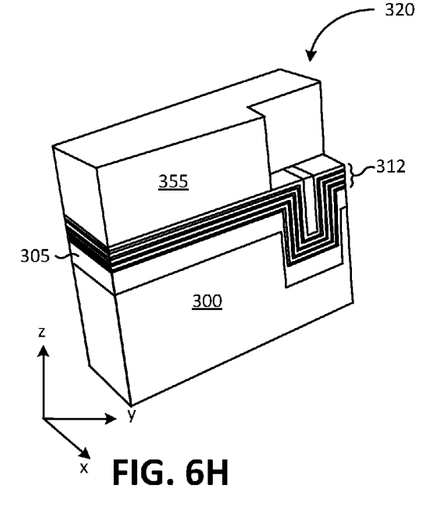
FIG. 6H is a perspective view of a photolithographic mask suitable for exposing the continuations of OP layers in the trench.

At step 445, a second photolithographic mask (e.g., pattern/photo 355) may be formed on the surface of the structure of FIG. 6G, as shown in FIG. 6H, in order to facilitate exposing continuations of OP layers 312 in the trench 320.

Figure 6J:
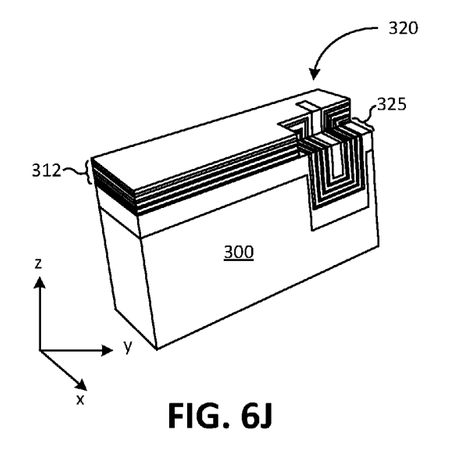
FIG. 6J illustrates exposed continuations of the OP layers in a single plane.

An OP etch-back procedure may be performed at step 450 according to the photolithographic mask 355 to create a horizontal plane 325 (FIG. 6J) in which continuations of conducting layers are exposed and made available for connection to vertically-oriented conducting structures. FIG. 2 illustrates one example wherein a horizontal plane 125 exposes parts of descending portions 113 and ascending portions 116 of continuations of conducting layers 110. Vertically-oriented conducting elements 130/132 are illustrated in FIG. 2 as making electrical contact with the continuations in the plane 125.

The vertically-oriented conducting structures may be formed in a manner similar to that described above with reference to FIG. 1A. That is, a stop layer (which may comprise SIN) and an interdielectric layer (ILD) may be deposited on the structure of FIG. 6J at step 455. The resulting structure may then be patterned according to specified contact openings at step and a contact etch performed at step 465.

As all connections to the OP layers 312 (FIGS. 6E-6J) are available at a single level in the plane 325 (FIG. 6J), all contact openings may have substantially the same aspect ratio, thereby expanding the process window associated with the breakthrough of the SIN layer when compared with the corresponding operation using a staircase structure. As suggested above in the description of FIG. 2, an implementation of the method may permit formation of redundant contact openings, thereby improving reliability of the 3D memory structure fabricated as described herein.

Although the disclosure herein refers to certain illustrated examples and embodiments, it is to be understood that these examples and embodiments have been presented by way of example rather than limitation. The intent accompanying this disclosure is to have such examples and embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A contact structure for a NAND-based non-volatile memory device comprising:
   alternating layers of conducting material and insulating material disposed horizontally over a substrate in a first region of a structure;
   a trench formation in a second region of the structure adjacent to the first region, the trench formation being configured with continuations of the alternating layers of conducting material and insulating material disposed on at least one side of the trench;
   a cut-away portion of the trench formation that exposes the continuations to the conducting material on one level in a horizontal plane; and
   vertically-oriented conducting structures that are electrically connected with the continuations of the layers of conducting material such that the vertically-oriented conducting structures are electrically connected to the layers of conducting material in the first region.

2. The contact structure as set forth in claim 1, wherein the continuations are disposed on two sides and a bottom of the trench.

3. The contact structure as set forth in claim 2, further comprising redundant vertically oriented conducting structures that form electrical connections with the continuations of the layers of conducting material.

4. The contact structure as set forth in claim 1, wherein the conducting material comprises polysilicon, metal, or combinations of two or more materials including Al, Cu, W, Ti, Co, Ni, TiN, TaN and TaAlN.

5. The contact structure as set forth in claim 1, wherein the insulating material comprises one or more of oxide, nitride, oxynitride, and silicate.

6. The contact structure as set forth in claim 1, wherein the insulating material comprises material having a dielectric constant less than that of silicon dioxide.

7. The contact structure as set forth in claim 6, wherein the insulating material comprises SiCHOx.

8. The contact structure as set forth in claim 1, wherein the insulating material comprises material having a dielectric constant greater than that of silicon dioxide.

9. The contact structure as set forth in claim , wherein the insulating material comprises one or more of HfOx, HfON, AlOx, RuOx and TiOx.

10. The contact structure as set forth in claim 1, wherein the trench has a substantially polygonal profile.

11. The contact structure as set forth in claim 10, wherein the trench has a substantially rectangular profile.

12. The contact structure as set forth in claim 10, wherein the trench has a substantially trapezoidal profile.

13. The contact structure as set forth in claim 1, wherein the trench has a curved profile.

14. The contact structure as set forth in claim 1 which is for a three-dimensional semiconductor NAND memory device.

15. The contact structure as set forth in claim 1, wherein the cut-away portion is configured to enable electrical connections between the layers of conducting material and the vertically-oriented conducting structures.

16. A NAND-based non-volatile memory device comprising:
   a first region having disposed therein a plurality of alternating layers of conducting and insulating material oriented substantially horizontally;
   a second region disposed adjacent the first region, the second region having a trench disposed therein;
   continuations of the layers of conducting and insulating material that are disposed within the trench;
   a cut-out portion of the second region that exposes a plurality of horizontal connections to the layers of conducting material at a substantially same level; and
   a plurality of vertically-oriented conductors that are in electrical contact with the horizontal connections such that the vertically-oriented conducting structures are electrically connected to the layers of conducting material in the first region.

17. The NAND-based non-volatile memory device as set forth in claim 16 further comprising a plurality of redundant vertically-oriented conductors.

18. The NAND based non-volatile memory device as set forth in claim 16 which is a three dimensional memory device.

19. The NAND based non-volatile memory device as set forth in claim 16, wherein the continuations are disposed on two sides and a bottom of the trench.

20. The NAND based non-volatile memory device as set forth in claim 16, wherein the conducting material comprises polysilicon, metal, or combinations of two or more materials including Al, Cu, W, Ti, Co, Ni, TiN, TaN or TaAlN.

21. The NAND based non-volatile memory device as set forth in claim 16, wherein the insulating material comprises one or more of oxide, nitride, oxynitride, or silicate.

22. The NAND based non-volatile memory device as set forth in claim 16, wherein the insulating material comprises material having a dielectric constant less than that of silicon dioxide.

23. The NAND based non-volatile memory device as set forth in claim 16, wherein the insulating material comprises material having a dielectric constant greater than that of silicon dioxide.

24. The NAND based non-volatile memory device as set forth in claim 23, wherein the insulating material comprises one or more of HfOx, HfON, AlOx, RuOx and TiOx.

25. The NAND based non-volatile memory device as set forth in claim 16, wherein the trench has a profile that is one of a polygonal profile, a substantially rectangular profile, a trapezoidal profile, or a curved profile.

* * * * *